United States Patent
Taracila et al.

(10) Patent No.: US 10,295,623 B2
(45) Date of Patent: May 21, 2019

(54) SYSTEM AND METHOD FOR MAGNETIC RESONANCE IMAGING ONE OR MORE SUBJECTS

(71) Applicant: GENERAL ELECTRIC COMPANY, Schenectady, NY (US)

(72) Inventors: Victor Taracila, Orange Village, OH (US); Fraser Robb, Aurora, OH (US); Eddy Boskamp, San Diego, CA (US); Daniel Chirayath, Akron, OH (US); Shuying Huang, Murfreesboro, TN (US); Madhwesha Rao, Sheffield (GB); James Wild, Sheffield (GB)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 168 days.

(21) Appl. No.: 15/337,197

(22) Filed: Oct. 28, 2016

(65) Prior Publication Data

US 2018/0120391 A1   May 3, 2018

(51) Int. Cl.
| | |
|---|---|
| *G01R 33/34* | (2006.01) |
| *G01R 33/36* | (2006.01) |
| *G01R 33/54* | (2006.01) |

(52) U.S. Cl.
CPC ... *G01R 33/3628* (2013.01); *G01R 33/34076* (2013.01); *G01R 33/3635* (2013.01); *G01R 33/3664* (2013.01); *G01R 33/543* (2013.01)

(58) Field of Classification Search
CPC .......... G01R 33/34076; G01R 33/3415; G01R 33/3635; G01R 33/34007; G01R 33/3628; G01R 33/365; G01R 33/3657; G01R 33/4828; G01R 33/34053; G01R 33/34092; G01R 33/3642; G01R 33/3664; G01R 33/446; G01R 33/5612; G01R 33/543

See application file for complete search history.

(56) References Cited

U.S. PATENT DOCUMENTS

| | | | | |
|---|---|---|---|---|
| 8,106,656 | B2 | 1/2012 | Wosik et al. | |
| 2009/0251145 | A1* | 10/2009 | Kaneko | G01R 33/34046 324/318 |
| 2010/0054570 | A1* | 3/2010 | Lamerichs | G01R 33/56509 382/131 |
| 2010/0117652 | A1* | 5/2010 | Cork | G01R 33/3415 324/322 |
| 2011/0140699 | A1* | 6/2011 | Fujimoto | G01R 33/34076 324/318 |

(Continued)

FOREIGN PATENT DOCUMENTS

WO        2014053289 A1     4/2014

*Primary Examiner* — Rodney A Bonnette
(74) *Attorney, Agent, or Firm* — Grogan, Tuccillo & Vanderleeden, LLP (57) ABSTRACT

An MRI system for imaging one or more subjects is provided. The MRI system includes a magnet assembly and an MRI controller. The magnet assembly includes an RF coil for transmitting a first set of RF pulses into the one or more subjects at an initial Larmor frequency. The MRI controller is configured to electronically communicate with the RF coil and to adjust a resonant frequency of the RF coil such that the RF coil transmits a second set of RF pulses into the one or more subjects at one or more subsequent Larmor frequencies that are different from the initial Larmor frequency.

26 Claims, 7 Drawing Sheets

(56) References Cited

U.S. PATENT DOCUMENTS

| | | | |
|---|---|---|---|
| 2012/0308111 A1* | 12/2012 | Stehning | G01R 33/3415 382/131 |
| 2013/0314091 A1* | 11/2013 | Otake | G01R 33/365 324/322 |
| 2014/0055136 A1* | 2/2014 | Leussler | G01R 33/3415 324/309 |
| 2014/0062482 A1* | 3/2014 | Vitacolonna | G01R 33/3415 324/309 |
| 2014/0145722 A1* | 5/2014 | Suzuki | G01R 33/34076 324/322 |
| 2014/0320130 A1* | 10/2014 | Nistler | G01R 33/3642 324/322 |
| 2015/0002156 A1* | 1/2015 | Leussler | G01R 33/3635 324/322 |
| 2015/0253393 A1* | 9/2015 | Harvey | G01R 33/34076 324/322 |
| 2015/0285882 A1* | 10/2015 | Mezrich | G01R 33/4828 324/309 |

* cited by examiner

SYSTEM AND METHOD FOR MAGNETIC RESONANCE IMAGING ONE OR MORE SUBJECTS

BACKGROUND

Technical Field

Embodiments of the invention relate generally to superconducting magnets and, more specifically, to a system and method for magnet resonance imaging one or more subjects.

Discussion of Art

Magnetic resonance imaging ("MRI") is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject to be imaged. The nuclei are excited by a radio frequency ("RF") signal/pulse transmitted by an RF coil at characteristic NMR (Larmor) frequencies. By spatially disturbing localized magnetic fields surrounding the subject, and analyzing the resulting RF responses from the nuclei as the excited protons relax back to their lower energy normal state, a map or image of these nuclei responses as a function of their spatial location is generated and displayed. An image of the nuclei responses provides a non-invasive view of a subject's internal structure.

RF coils of MRI systems are typically configured to resonate at the Larmor frequency of hydrogen ("H") in a given $B_0$ field. Accordingly, many MRI systems are only able to generate images based on RF responses from hydrogen atoms. While some MRI systems have RF coils configured to resonate at Larmor frequencies other than the one for hydrogen in a given $B_0$ field, such RF coils typically have a "clamshell"/"Tropp" design, as opposed to a "whole body" design, and are thus usually incapable of imaging an entire patient in a single scan. While some MRI systems have "birdcage" RF coils configured to resonate at Larmor frequencies other than the one for hydrogen in a given $B_0$ field, such birdcage RF coils, like the clamshell designed RF coils, are usually adapted to image localized regions of a subject/patient, e.g., head, knee, wrist, ankle, etc.

What is needed, therefore, is an improved MRI system and method for imaging one or more subjects.

BRIEF DESCRIPTION

In an embodiment, an MRI system for imaging one or more subjects is provided. The MRI system includes a magnet assembly and an MRI controller. The magnet assembly includes an RF coil for transmitting a first set of RF pulses into the one or more subjects at an initial Larmor frequency. The MRI controller is configured to electronically communicate with the RF coil and to tune a resonant frequency of the RF coil such that the RF coil transmits a second set of RF pulses into the one or more subjects at one or more subsequent Larmor frequencies that are different from the initial Larmor frequency.

In another embodiment, a method for magnetic resonance imaging one or more subjects is provided. The method includes: transmitting a first set of RF pulses at an initial Larmor frequency into the one or more subjects via an RF coil; tuning a resonant frequency of the RF coil to a subsequent Larmor frequency that is different from the initial Larmor frequency; and transmitting a second set of RF pulses at the subsequent Larmor frequency into the one or more subjects via the RF coil.

In yet another embodiment, an RF coil for an MRI system is provided. The RF coil includes one or more rungs connected together via one or more rings, and one or more tuning modules disposed between the rungs so as to affect a resonant frequency of the RF coil. The one or more tuning modules are adjustable so as to tune the resonant frequency from an initial Larmor frequency to one or more subsequent Larmor frequencies that are different from the initial Larmor frequency.

In still yet another embodiment, another MRI system for imaging one or more subjects is provided. The MRI system includes a magnet assembly that includes a first RF coil and a second RF coil both of a birdcage design having rungs connected by rings. The first RF coil is for transmitting a first set of RF pulses into the one or more subjects at a first Larmor frequency, and the second RF coil is for transmitting a second set of RF pulses into the one or more subjects at a second Larmor frequency different from the first Larmor frequency. The first RF coil and the second RF coil are disposed within the magnet assembly such that the rungs and the rings of the first RF coil are offset from the rungs and the rings of the second RF coil.

In still yet another embodiment, another method for magnetic resonance imaging one or more subjects is provided. The method includes: transmitting a first set of RF pulses into the one or more subjects via a first RF coil at a first Larmor frequency; and transmitting a second set of RF pulses into the one or more subjects via a second RF coil at a second Larmor frequency that is different from the first Larmor frequency. Both the first RF coil and the second RF coil are of a birdcage design having rungs connected by rings, and the first RF coil and the second RF coil are disposed within a magnet assembly such that the rungs and the rings of the first RF coil are offset from the rungs and the rings of the second RF coil.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "coupled", "electrically coupled", "electrically connected", and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. Additionally, the terms "resonant frequency," "transmission frequency" and "reception frequency," as used herein with respect to an RF coil, refer to the frequency of RF signals/pulses that the RF coil is configured to transmit and receive.

As used herein with respect to an RF coil and a referenced frequency, the term "tuned" means that the resonant/transmission/reception frequency of the RF coil is the referenced frequency. The terms "tune" and "tuning," as used herein with respect to an RF coil and a referenced frequency, refer to the process of adjusting a resonant/transmission/reception frequency of the RF coil to the referenced frequency.

Further, while the embodiments disclosed herein are described with respect to an MRI system, it is to be understood that embodiments of the present invention may be applicable to other imaging systems. Further still, as will be appreciated, embodiments of the present invention related imaging systems may be used to analyze tissue generally and are not limited to human tissue.

Figure 1:
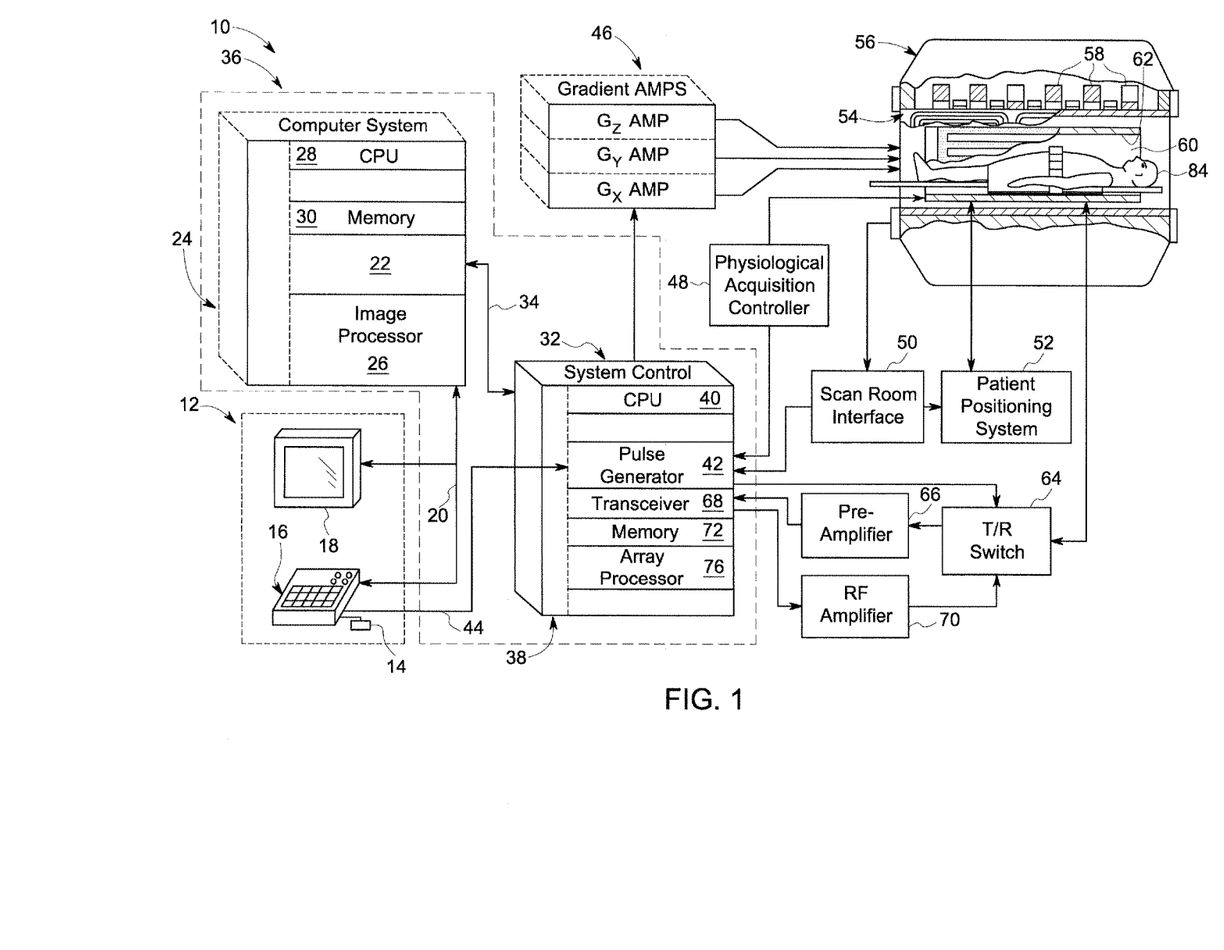
FIG. 1 is a block diagram of an exemplary MRI system in accordance with an embodiment of the invention.

Referring now to FIG. 1, the major components of an MRI system 10 incorporating an embodiment of the invention are shown. Operation of the system 10 is controlled from the operator console 12, which includes a keyboard or other input device 14, a control panel 16, and a display screen 18. The console 12 communicates through a link 20 with a separate computer system 22 that enables an operator to control the production and display of images on the display screen 18. The computer system 22 includes a number of modules, which communicate with each other through a backplane 24. These include an image processor module 26, a CPU module 28 and a memory module 30, which may include a frame buffer for storing image data arrays. The computer system 22 communicates with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription.

The computer system 22 and the MRI system control 32 collectively form an "MRI controller" 36. As will be appreciated, however, in embodiments, the MRI controller 36 need not be two physically separate components but may be a single component, or, alternatively more than two components, with the functionality of the system 22 and controller 32.

The MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan.

The pulse generator module 42 can also receive patient data from a physiological acquisition controller 48 that receives signals from a number of different sensors connected to the patient, such as ECG signals from electrodes attached to the patient. Finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals. The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

The MR signals picked up by the RF coil 62 are digitized by the transceiver module 68 and transferred to a memory module 72 in the system control 32. A scan is complete when an array of raw k-space data has been acquired in the memory module 72. This raw k-space data/datum is rearranged into separate k-space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26 and conveyed to the operator console 12 and presented on the display 18.

Figure 2:
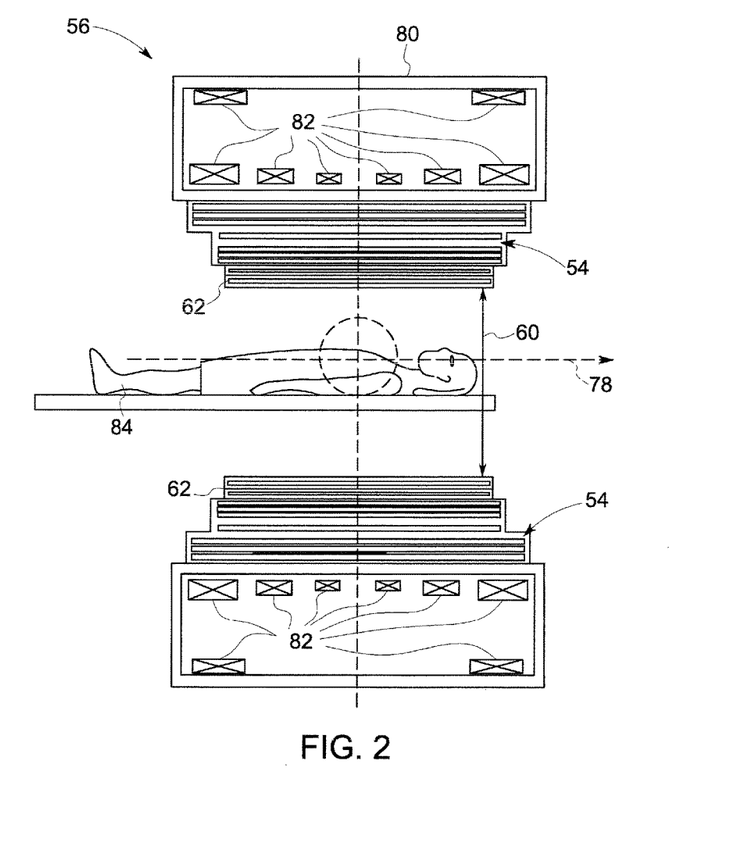
FIG. 2 is a schematic cross-sectional view of a magnet assembly of the MRI system of FIG. 1 in accordance with an embodiment of the invention.

As illustrated in FIG. 2, a schematic side elevation view of the magnet assembly 56 is shown in accordance with an embodiment of the invention. The magnet assembly 56 is cylindrical in shape having a center axis 78. The magnet assembly 56 includes a cryostat 80 and one or more radially aligned longitudinally spaced apart superconductive coils 82 that form the polarizing magnet 58. The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system (10 in FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

Figure 3:
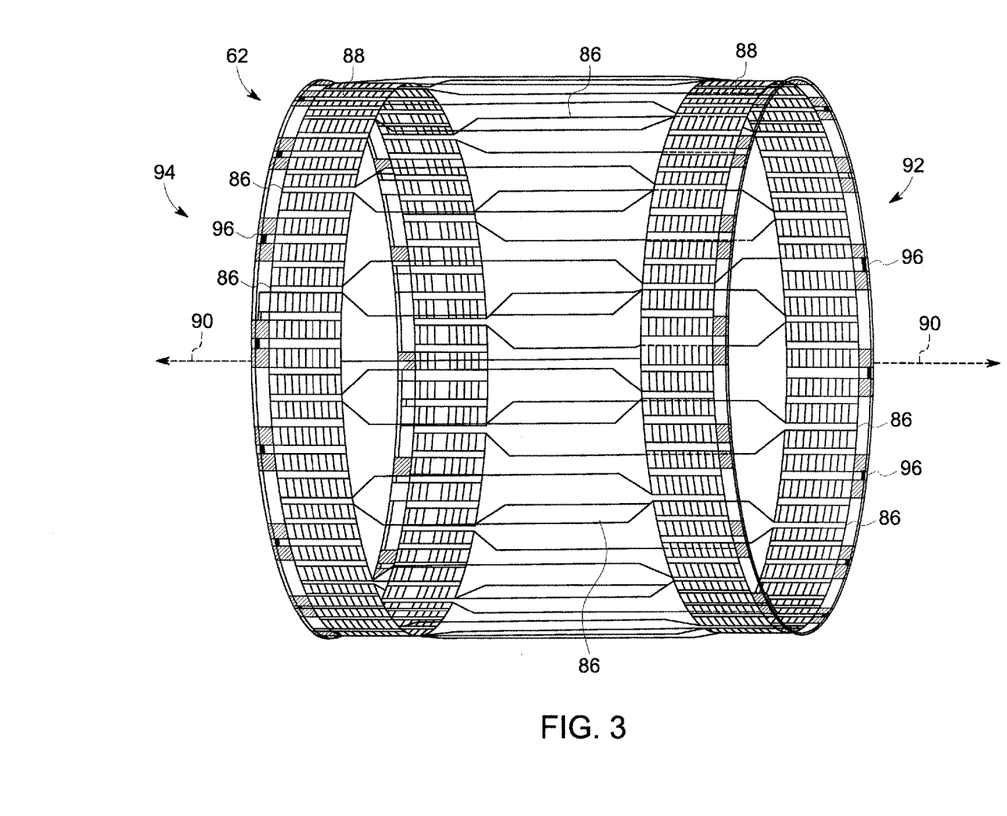
FIG. 3 is an RF coil of the magnet assembly of FIG. 2 in accordance with an embodiment of the invention.

Turning now to FIG. 3, an embodiment of the RF coil 62 is shown. The RF coil 62 may be of a birdcage design having one or more rungs 86 connected together via one or more rings 88 disposed along a longitudinal axis 90 that aligns with the central axis 78 of the magnet assembly 56. While FIG. 3 depicts the RF coil 62 as a High Pass ("HP") birdcage, it is to be understood that in embodiments, the RF coil 62 may be of a low-pass ("LP") birdcage design. Accordingly, in embodiments, the RF coil 62 may have a first end 92 and a second end 94, each end 92 and 94 defined by a ring 88 at which the rungs 86 terminate. While the RF coil 62 is depicted in the accompanying figures as having a birdcage design, it will be understood that the RF coil 62 may be of other designs typically utilized in MRI systems.

As further shown in FIG. 3, the RF coil 62 may include one or more tuning modules 96. In embodiments, the tuning modules 96 may be disposed between and electronically connected to the rungs 86 and/or at the first 92 and second 94 ends so as to affect the resonant frequency of the RF coil 62. In embodiments, the RF coil 62 may be a Wide Bore (70 cm) birdcage, for a 3T MRI system, having two (2) rings 88 with sixteen (16) tuning modules 96 disposed between the rungs 86 of each ring 88. As will be understood, the resonant frequency of the RF coil 62 is based at least in part on the configuration of the tuning modules 96 and, as described in greater detail below, the tuning modules 96 are adjustable so as to tune/adjust the resonant frequency of the RF coil 62.

Figure 4:
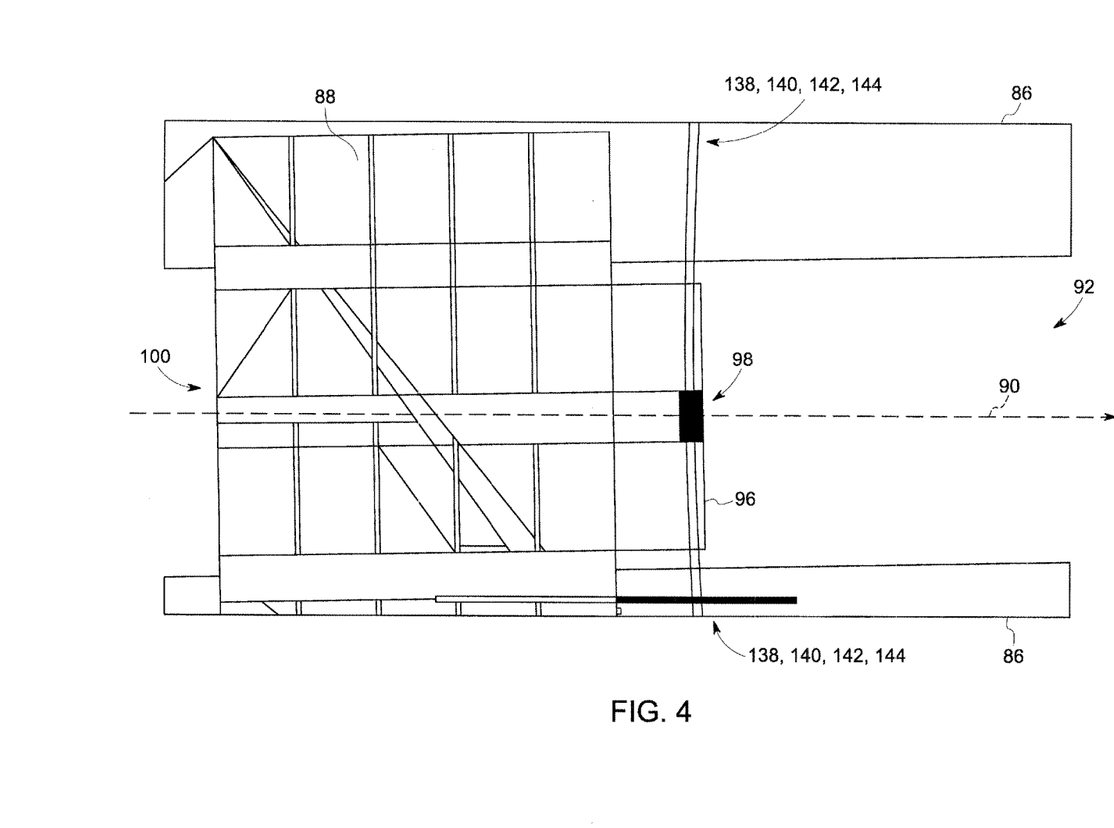
FIG. 4 is a tuning module of the RF coil of FIG. 3 in accordance with an embodiment of the invention.
Figure 5:
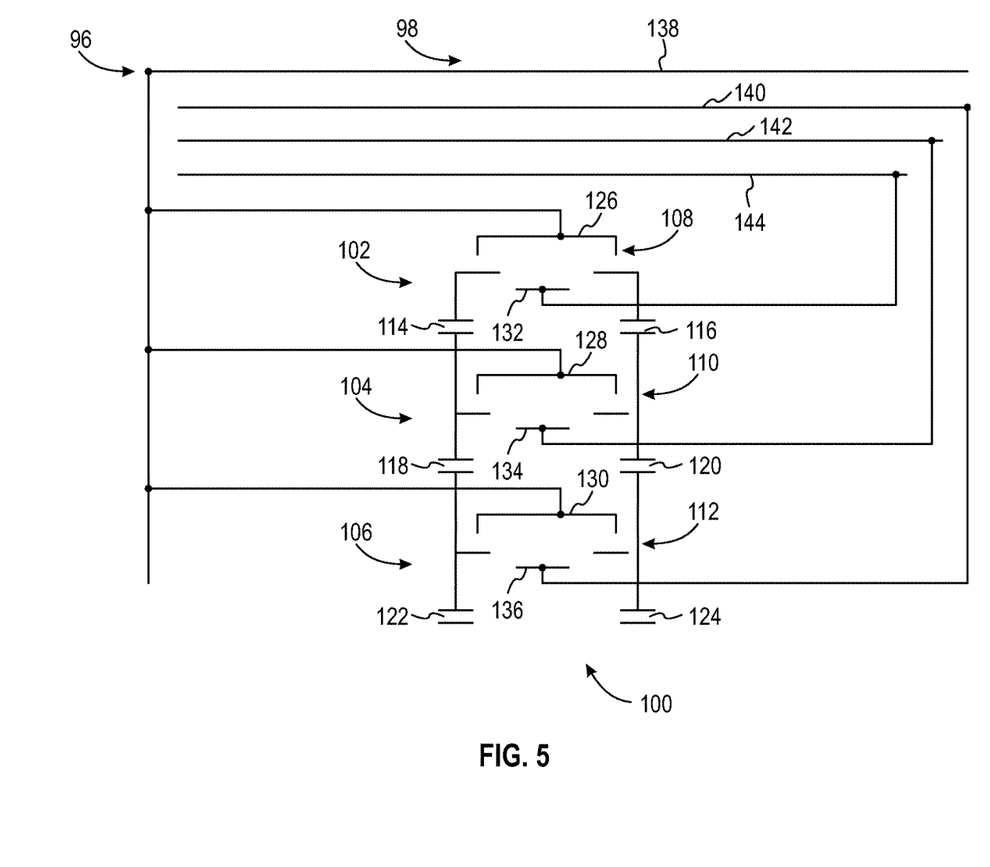
FIG. 5 is an electronic circuit diagram of the tuning module of FIG. 4 in accordance with an embodiment of the invention.

Accordingly, as shown in FIGS. 4 and 5, the tuning modules 96 may have an outer end 98 and an inner end 100 disposed opposite the outer end 98. The outer end 98 faces away from the RF coil 62, i.e., facing in the direction along the longitudinal axis 90 that leads away from the RF coil 62, and the inner end 100 faces the direction opposite the outer end 98. For example, shown in FIG. 4 is a tuning module 96 disposed in between two rungs 86 at the ring 88 that defines the first end 92 of the RF coil 62, wherein the outer end 98 faces away from the RF coil 62. Thus, as will be understood, the inner ends 100 of the tuning modules 96 disposed at the rings 88 defining the first 92 and the second ends 94 of the RF coil 62 will face each other.

As further shown in FIG. 5, each of the tuning modules 96 includes one or more capacitance blocks 102, 104, 106 that each have a Micro-Electro-Mechanical ("MEM") switch 108, 110, 112 connected in series with and disposed between two capacitors 114, 116, 118, 120, 122, 124. As will be appreciated, in each of the capacitance blocks, 102, 104, 106, the two capacitors may have the same capacitance, e.g. the capacitance of capacitors 114 and 116 are equal, the capacitance of capacitors 118 and 120 are equal, and the capacitance of capacitors 122 and 124 are equal. Each of the MEM switches 108, 110, 112 may be defined by a beam 126, 128, 130, and a gate 132, 134, 136. In embodiments, each of the capacitance blocks 102, 104, 106 are electronically connected to the two rungs 86 (FIG. 4) that the tuning module 96, which includes the capacitance blocks 102, 104, 106, is electronically connected to. For example, the tuning module 96 may include a ground wire 138 and one or more conductors 140, 142, 144 which may be electronically connected to the ground wires 138 and conductors 140, 142, 144 of other tuning modules 96 disposed at the same end 92/94 of the RF coil 62. The ground wire 138 and the conductors 140, 142, 144 may be high resistance directed current ("DC") twisted pairs. As will be appreciated, in embodiments, the ground wire 138 may be at 0.0 volts DC ("VDC") and the conductors 140, 142, 144 may each be at or greater than 80 VDC. Each conductor 140, 142, 144 may power/activate a corresponding MEM switch 108, 110, 112, thus closing the MEM switch 108, 110, 112 and increasing an overall capacitance C between the two rungs 86 at the end 92/94 of the RF coil 62 at which the tuning module 96 is disposed.

As will be appreciated, the resonant frequency ω of the RF coil 62 is based at least in part on the capacitance C. For example, in embodiments, the RF coil 62 may be tuned to an initial Larmor frequency $\omega_0$ which corresponds to an initial capacitance of $C_0$. Increasing the capacitance C between the rungs 86 of the RF coil 62 lowers the resonant frequency ω to a subsequent Larmor frequency $\omega_n$ having a corresponding capacitance of $C_n$. Accordingly, in embodiments, the capacitance for a desired Larmor frequency $\omega_n$ can be calculated via:

$$C_1 = \frac{\omega_0^2}{\omega_1^2} C_0$$

$$C_2 = \frac{\omega_0^2}{\omega_2^2} C_0$$

$$C_3 = \frac{\omega_0^3}{\omega_2^2} C_2$$

where $C_1$, $C_2$, and $C_3$ represent the capacitance between the rungs 86 of the RF coil 62 at the three Larmor frequencies $\omega_1$, $\omega_2$, and $\omega_3$. The capacitance $C_n$ for additional Larmor frequencies can be calculated in a similar manner. Accordingly, the "tuning degree," i.e, the number of Larmor frequencies that the RF coil 62 may be tuned to, corresponds to the number of capacitance blocks 102, 104, 106 in the tuning modules 96. For example, tuning modules 96 having a single tuning block 106 provide for a "double tunable" RF coil 62 capable of transmitting and/or receiving RF pulses at two different Larmor frequencies; tuning modules 96 having two tuning blocks 106 and 104 provide for a "triple tunable" RF coil 62 capable of transmitting and/or receiving RF pulses at three different Larmor frequencies; and tuning modules 96 having three tuning blocks 106, 104, and 102 provide for a "quadruple tunable" RF coil 62 capable of transmitting and/or receiving RF pulses at four different Larmor frequencies. Therefore, as can be seen, increasing the number of capacitance blocks 102, 104, 106 in the tuning modules 96 of the RF coil 62 increases the tuning degree of the RF coil 62. For example, adding a fourth capacitance block (not shown) would provide for a "quintuple tunable"

RF coil 62 capable of transmitting and/or receiving RF pulses at five different Larmor frequencies. As can also be seen, in embodiments, each of the capacitance blocks 102, 104, 106 corresponds to a subsequent Larmor frequency where $\omega_0$ may correspond to Hydrogen, $\omega_1$ may correspond to carbon ("C"), e.g., carbon thirteen ("C13"), and $\omega_2$ may correspond to sodium ("Na"). As will be appreciated, in embodiments, the RF coil 62 may be configured to transmit and/or receive RF pulses at Larmor frequencies corresponding to Helium ("He"), Xenon ("Xe"), Fluorine ("F"), and/or other atomic nuclei of interest.

Accordingly, in embodiments having two or more capacitance blocks in a tuning module 96, the capacitance blocks 102, 104, 106 are electronically connected to each other in a descending cascading order with respect to the corresponding Larmor frequencies. For example, in embodiments, the RF coil 62 may be at $C_o$ and $\omega_0$ when all of the MEM switches 108, 110, and 112 are open. The RF coil 62 may then be transitioned/tuned to $C_1$ and $\omega_1$ by closing MEM switch 112, further transitioned/tuned to $C_2$ and $\omega_2$ by additionally closing MEM switch 110, and still further transitioned to $C_3$ and $\omega_3$ by additionally closing MEM switch 108. Thus, as will be appreciated, in embodiments where the two capacitors of a capacitance block are the same, the capacitance $C_{xn}$ of the capacitors required to achieve $C_n$ can be calculated via:

$$C_{xn} = 2\frac{(C_0 - C_{n-1})(C_0 - C_n)}{C_{n-1} - C_n}$$

Thus, the capacitance $C_{x1}$ of the two capacitors 122 and 124 of capacitance block 106 may be calculated via:

$$C_{x1} = 2(C_1 - C_0);$$

the capacitance $C_{x2}$ of the two capacitors 118 and 120 of capacitance block 104 may be calculated via:

$$C_{x2} = 2\frac{(C_0 - C_1)(C_0 - C_2)}{C_1 - C_2};$$

and the capacitance $C_{x3}$ of the two capacitors 114 and 116 of capacitance block 102 may be calculated via:

$$C_{x3} = 2\frac{(C_0 - C_2)(C_0 - C_3)}{C_2 - C_3}.$$

Accordingly, the capacitance $C_{x4}$ of the two capacitors of an additional fourth capacitance block (not shown) may be calculated via:

$$C_{x4} = 2\frac{(C_0 - C_3)(C_0 - C_4)}{C_3 - C_4}.$$

It will also be appreciated that, in embodiments, the tuning modules 96 may include inductors, as opposed to capacitors, and/or a combination of inductors and capacitors.

Figure 6:
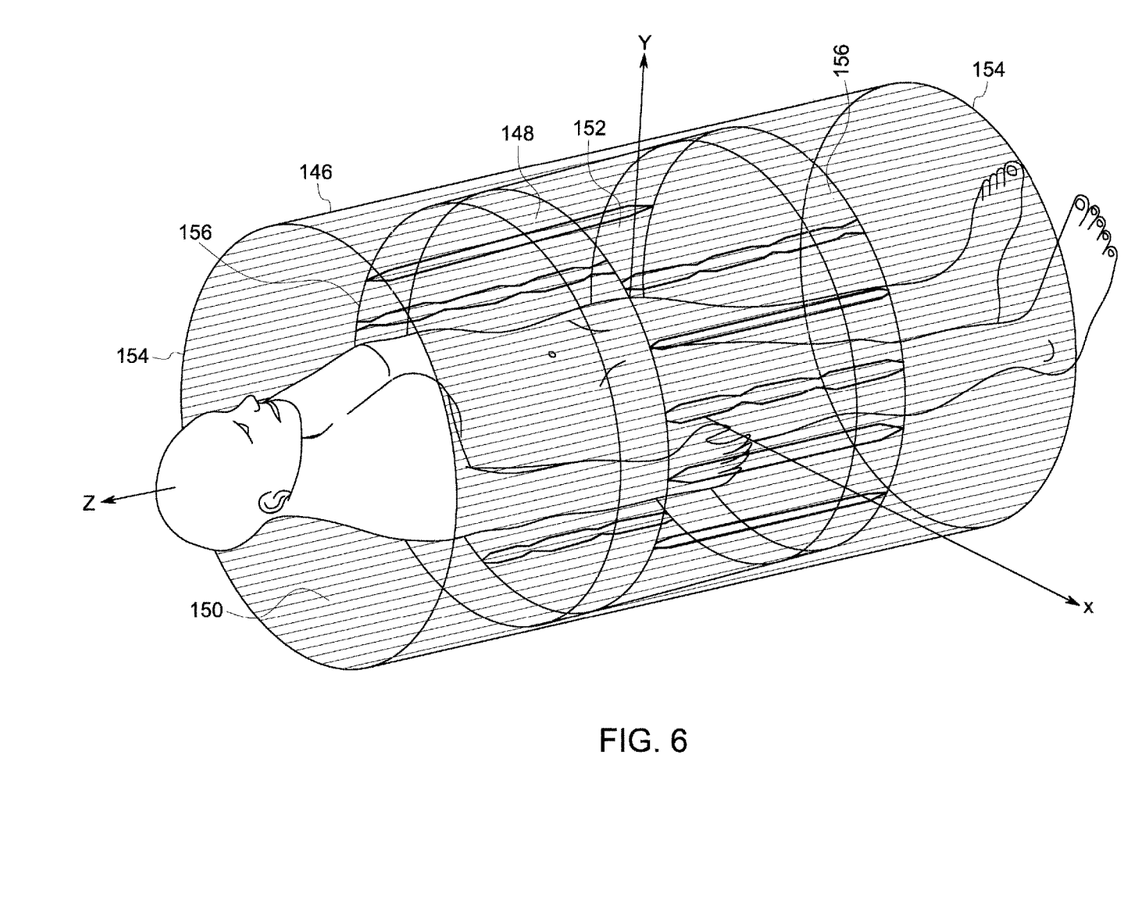
FIG. 6 is a perspective view of another embodiment of an RF coil of the magnet assembly of FIG. 2.
Figure 7:
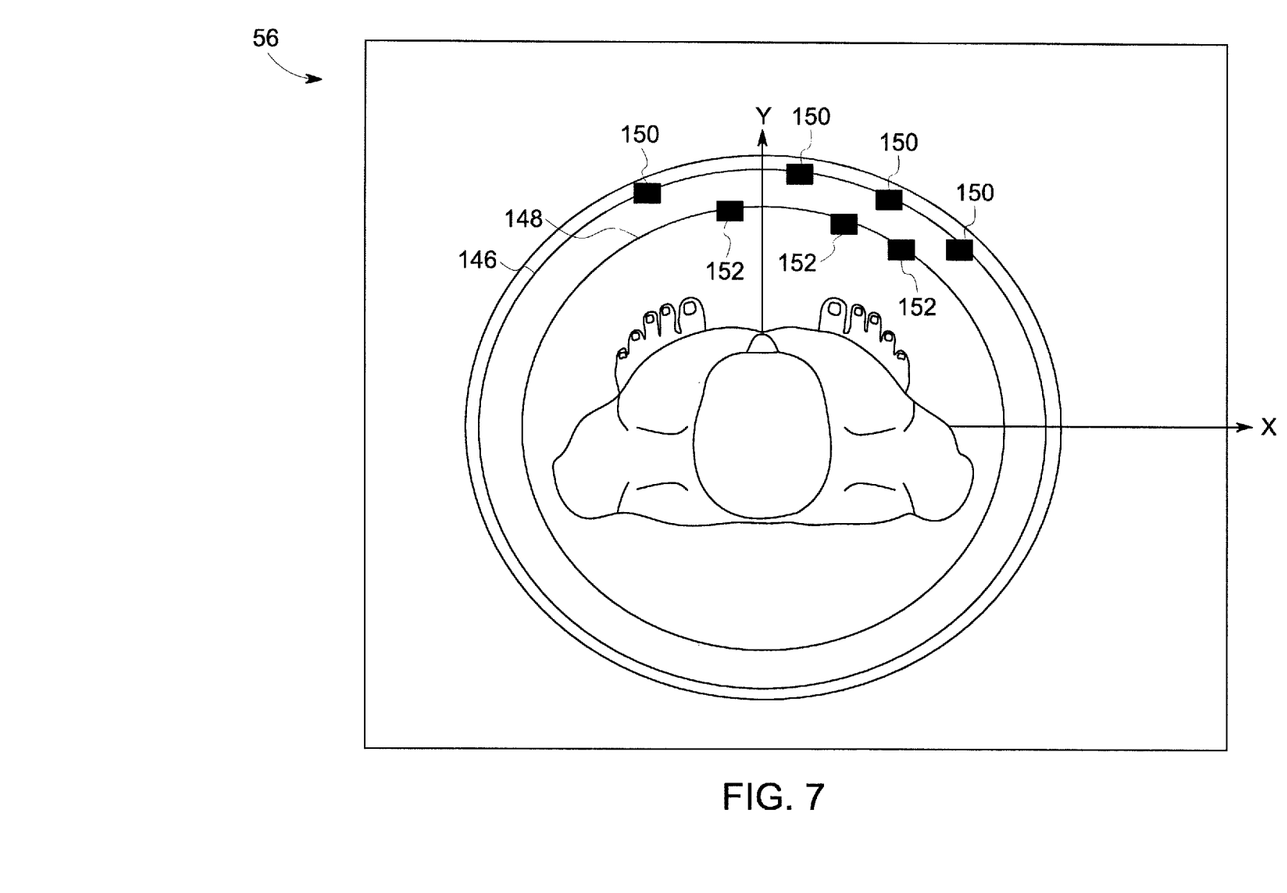
FIG. 7 is a view down a longitudinal axis of the RF coil of FIG. 6 in accordance with an embodiment of the invention.

Moving now to FIGS. 6 and 7, in embodiments, the magnet assembly 56 may include a first RF coil 146 and a second RF coil 148, which in embodiments, may both be of a birdcage design having rungs 150, 152 connected by rings 154, 156. The first RF coil 146 transmits and/or receives a first set of RF pulses at a first Larmor frequency, and the second RF coil 148 transmits and/or receives a second set of RF pulses at a second Larmor frequency different from the first Larmor frequency. For example, in embodiments, the first RF coil 146 may be a HP birdcage configured to transmit and/or receive RF pulses at the Larmor frequency for hydrogen, and the second RF coil may be a LP birdcage configured to transmit and/or receive RF pulses at the Larmor frequency for carbon thirteen ("C13"). In embodiments, the first 146 and the second 148 RF coils may transmit and/or receive simultaneously with respect to each other, e.g., the first 146 and the second 148 RF coils may provide for simultaneous MRI imaging of the subject 84. For example, the second RF coil 148 may receive while the first RF coil 146 transmits or vice versa. Additionally, the first 146 and/or the second 148 RF coils may include tuning modules 96 (FIGS. 3-5) such that the resonant frequency of the first 146 and/or the second 148 RF coils can be tuned to provide for simultaneous switchable multi-nuclei ("SSMN") MRI imaging of the subject 84. For example, in embodiments, the first 146 and the second 148 RF coils may provide for simultaneous MRI imaging of 1H and 23Xe, with the ability to switch/tune so as to simultaneously image 3He and 19F. In embodiments, the first 146 and the second 148 RF coils may provide for simultaneous MRI imaging of 1H and 13C and then switch/tune so as to simultaneously image 23Na. As will be appreciated, in such embodiments, the first 146 and the second 148 RF coils may be linearly excited/energized, e.g., not circularly, and the ports of the first 146 and the second 148 RF coils bay be orthogonal, e.g., not coupled.

In embodiments, the second RF coil 148 may be disposed within the first RF coil 146 such that the rungs 152 and rings 156 of the second RF coil 148 are offset from the rungs 150 and rings 154 of the first RF coil 146. As will be understood, offsetting the rungs 152 and rings 156 of the second RF coil 148 from the rungs 150 and the rings 154 of the first RF coil 146 reduces the amount of electronic coupling between the first 146 and the second 148 RF coils. Accordingly, in embodiments, the first RF coil 146 may be a seventy (70) cm HP birdcage and the second RF coil 148 may be a sixty (60) cm LP birdcage.

As will be appreciated, in embodiments, the second RF coil 148 may be fixed within the magnet assembly 56 in the same manner as the first RF coil 146. In other embodiments, however, the second RF coil 148 may be removably inserted into the first RF coil 146, i.e., the second RF coil 148 may be a removable insert.

Finally, it is also to be understood that the MRI system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the MRI system 10 may include at least one processor (e.g., 28, 40, and 76 in FIG. 1), and system memory/data storage structures (e.g., 30 and 72 in FIG. 1), which may include random access memory (RAM) and read-only memory (ROM). The at least one processor of the MRI system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that provides for tuning of the RF coil 62 may be read into a main memory of the at least one processor from a computer-readable medium. The term "computer-readable medium", as used herein, refers to any medium that provides or participates in providing instructions to the at least one processor of the MRI system 10 (or any other processor of a device described herein) for execution. Such a medium may take many forms, including but not limited to, non-volatile media and volatile media. Non-volatile media include, for example, optical, magnetic, or opto-magnetic disks, such as memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, a RAM, a PROM, an EPROM or EEPROM (electronically erasable programmable read-only memory), a FLASH-EEPROM, any other memory chip or cartridge, or any other medium from which a computer can read.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

For example, in an embodiment, an MRI system for imaging one or more subjects is provided. The MRI system includes a magnet assembly and an MRI controller. The magnet assembly includes an RF coil for transmitting a first set of RF pulses into the one or more subjects at an initial Larmor frequency. The MRI controller is configured to electronically communicate with the RF coil and to tune a resonant frequency of the RF coil such that the RF coil transmits a second set of RF pulses into the one or more subjects at one or more subsequent Larmor frequencies that are different from the initial Larmor frequency. In certain embodiments, at least one of the initial Larmor frequency and the subsequent Larmor frequencies correspond to hydrogen atoms, carbon atoms, sodium atoms, fluorine atoms, helium atoms, or xenon atoms. In certain embodiments, the RF coil includes one or more tuning modules that affect the resonant frequency of the RF coil, and the controller tunes the resonant frequency of the RF coil by adjusting the one or more tuning modules. In certain embodiments, the RF coil is of a birdcage design having one or more rungs, and the one or more tuning modules are disposed between the rungs. In certain embodiments, each of the one or more tuning modules includes one or more capacitance blocks each having a MEM switch connected in series with and disposed between two capacitors. In certain embodiments, in each of the one or more capacitance blocks, the two capacitors have the same capacitance. In certain embodiments, each of the one or more capacitance blocks corresponds to one of the one or more subsequent Larmor frequencies, and the one or more capacitance blocks are electronically connected to each other in a descending cascading order with respect to the corresponding subsequent Larmor frequencies.

Other embodiments provide for a method for magnetic resonance imaging one or more subjects. The method includes: transmitting a first set of RF pulses at an initial Larmor frequency into the one or more subjects via an RF coil; tuning a resonant frequency of the RF coil to a subsequent Larmor frequency that is different from the initial Larmor frequency; and transmitting a second set of RF pulses at the subsequent Larmor frequency into the one or more subjects via the RF coil. In certain embodiments, at least one of the initial Larmor frequency and the subsequent Larmor frequency correspond to hydrogen atoms, carbon atoms, sodium atoms, fluorine atoms, helium atoms, or xenon atoms. In certain embodiments, tuning a resonant frequency of the RF coil to a subsequent Larmor frequency that is different from the initial Larmor frequency includes adjusting one or more tuning modules of the RF coil. In certain embodiments, the RF coil is of a birdcage design having one or more rungs, and the one or more tuning modules are disposed between the rungs. In certain embodiments, adjusting one or more tuning modules of the RF coil includes adjusting a MEM switch connected in series with and disposed between two capacitors within a capacitance block of one of the one or more tuning modules. In certain embodiments, the two capacitors have the same capacitance.

Yet still other embodiments provide for an RF coil for an MRI system. The RF coil includes one or more rungs connected together via one or more rings, and one or more tuning modules disposed between the rungs so as to affect a resonant frequency of the RF coil. The one or more tuning modules are adjustable so as to tune the resonant frequency from an initial Larmor frequency to one or more subsequent Larmor frequencies that are different from the initial Larmor frequency. In certain embodiments, at least one of the initial Larmor frequency and the subsequent Larmor frequencies correspond to hydrogen atoms, carbon atoms, sodium atoms, fluorine atoms, helium atoms, or xenon atoms. In certain embodiments, each of the one or more tuning modules includes one or more capacitance blocks each having a MEM switch connected in series with and disposed between two capacitors. In certain embodiments, in each of the one or more capacitance blocks, the two capacitors have the same capacitance. In certain embodiments, each of the one or more capacitance blocks corresponds to one of the one or more subsequent Larmor frequencies, and the one or more capacitance blocks are electronically connected to each other in a descending cascading order with respect to the corresponding subsequent Larmor frequencies.

Yet still other embodiments provide for another MRI system for imaging one or more subjects. The MRI system includes a magnet assembly that includes a first RF coil and a second RF coil both of a birdcage design having rungs connected by rings. The first RF coil is for transmitting a first set of RF pulses into the one or more subjects at a first Larmor frequency, and the second RF coil is for transmitting a second set of RF pulses into the one or more subjects at a second Larmor frequency different from the first Larmor frequency. The first RF coil and the second RF coil are disposed within the magnet assembly such that the rungs and the rings of the first RF coil are offset from the rungs and the rings of the second RF coil. In certain embodiments, at least one of the first Larmor frequency and the second Larmor frequency correspond to hydrogen atoms, carbon atoms, sodium atoms, fluorine atoms, helium atoms, or xenon atoms. In certain embodiments, the first RF coil is a HP birdcage coil and the second RF coil is a LP birdcage coil. In certain embodiments, the second RF coil is further disposed within the first RF coil.

Yet still other embodiments provide for another method for magnetic resonance imaging one or more subjects. The method includes: transmitting a first set of RF pulses into the one or more subjects via a first RF coil at a first Larmor frequency; and transmitting a second set of RF pulses into the one or more subjects via a second RF coil at a second Larmor frequency that is different from the first Larmor frequency. Both the first RF coil and the second RF coil are of a birdcage design having rungs connected by rings, and the first RF coil and the second RF coil are disposed within a magnet assembly such that the rungs and the rings of the first RF coil are offset from the rungs and the rings of the second RF coil. In certain embodiments, at least one of the first Larmor frequency and the second Larmor frequency correspond to hydrogen atoms, carbon atoms, sodium atoms, fluorine atoms, helium atoms, or xenon atoms. In certain embodiments, the first RF coil is a HP birdcage coil and the second RF coil is a LP birdcage coil disposed within the first RF coil. In certain embodiments, the first set of RF pulses and the second set of RF pulses are transmitted simultaneously.

Accordingly, as will be appreciated, by utilizing adjustable tuning modules to adjust the capacitance C of an RF coil, some embodiments of the invention provide for whole body birdcage RF coils to be used to image objects at Larmor frequencies different than that of hydrogen. For example, certain embodiments provide for an RF coil that may be tunable to both the Larmor frequency of hydrogen (127.73 MHz in a 3T $B_0$ field) and the Larmor frequency of C13 (32 MHz in a 3T $B_0$ field). Accordingly, such tunable RF coils provide for a greater field of view, i.e., a larger imaging region, than current clamshell RF coils. Moreover, some embodiments, in which the RF coil is used to both transmit and receive RF signals, simplify a patient's experience as a clamshell receiving coil is not required.

Further, and as will also be appreciated, embodiments having a second RF coil that is removably insertable into a first RF coil, wherein the second RF coil is tuned to a different Larmor frequency than the first RF coil, also provide for greater field of view as compared to clamshell RF coil designs.

Additionally, while the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format are not intended to be interpreted as such, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. An MRI system for imaging one or more subjects comprising:
   a magnet assembly that includes an RF coil for transmitting a first set of RF pulses into the one or more subjects at an initial Larmor frequency;
   an MRI controller configured to electronically communicate with the RF coil; and
   wherein the MRI controller is further configured to tune a resonant frequency of the RF coil such that the RF coil transmits a second set of RF pulses into the one or more subjects at one or more subsequent Larmor frequencies that are different from the initial Larmor frequency.

2. The MRI system of claim 1, wherein at least one of the initial Larmor frequency and the subsequent Larmor frequencies correspond to hydrogen atoms, carbon atoms, sodium atoms, fluorine atoms, helium atoms, or xenon atoms.

3. The MRI system of claim 1, wherein
   the RF coil includes one or more tuning modules that affect the resonant frequency of the RF coil, and
   the controller tunes the resonant frequency of the RF coil by adjusting the one or more tuning modules.

4. The MRI system of claim 3, wherein
   the RF coil is of a birdcage design having one or more rungs, and
   the one or more tuning modules are disposed between the rungs.

5. The MRI system of claim 3, wherein each of the one or more tuning modules includes one or more capacitance blocks each having a MEM switch connected in series with and disposed between two capacitors.

6. The MRI system of claim 5, wherein in each of the one or more capacitance blocks, the two capacitors have the same capacitance.

7. The MRI system of claim 5, wherein
each of the one or more capacitance blocks corresponds to one of the one or more subsequent Larmor frequencies, and
the one or more capacitance blocks are electronically connected to each other in a descending cascading order with respect to the corresponding subsequent Larmor frequencies.

8. A method for magnetic resonance imaging one or more subjects comprising:
transmitting a first set of RF pulses at an initial Larmor frequency into the one or more subjects via an RF coil;
tuning a resonant frequency of the RF coil to a subsequent Larmor frequency that is different from the initial Larmor frequency; and
transmitting a second set of RF pulses at the subsequent Larmor frequency into the one or more subjects via the RF coil.

9. The method of claim 8, wherein at least one of the initial Larmor frequency and the subsequent Larmor frequency correspond to hydrogen atoms, carbon atoms, sodium atoms, fluorine atoms, helium atoms, or xenon atoms.

10. The method of claim 8, wherein tuning a resonant frequency of the RF coil to a subsequent Larmor frequency that is different from the initial Larmor frequency comprises:
adjusting one or more tuning modules of the RF coil.

11. The method of claim 10, wherein
the RF coil is of a birdcage design having one or more rungs, and
the one or more tuning modules are disposed between the rungs.

12. The method of claim 10, wherein adjusting one or more tuning modules of the RF coil comprises:
adjusting a MEM switch connected in series with and disposed between two capacitors within a capacitance block of one of the one or more tuning modules.

13. The method of claim 12, wherein the two capacitors have the same capacitance.

14. An RF coil for an MRI system comprising:
one or more rungs connected together via one or more rings;
one or more tuning modules disposed between the rungs so as to affect a resonant frequency of the RF coil; and
wherein the one or more tuning modules are adjustable so as to tune the resonant frequency from an initial Larmor frequency to one or more subsequent Larmor frequencies that are different from the initial Larmor frequency.

15. The RF coil of claim 14, wherein at least one of the initial Larmor frequency and the subsequent Larmor frequencies correspond to hydrogen atoms, carbon atoms, sodium atoms, fluorine atoms, helium atoms, or xenon atoms.

16. The RF coil of claim 14, wherein each of the one or more tuning modules includes one or more capacitance blocks each having a MEM switch connected in series with and disposed between two capacitors.

17. The RF coil of claim 16, wherein in each of the one or more capacitance blocks, the two capacitors have the same capacitance.

18. The RF coil of claim 16, wherein each of the one or more capacitance blocks corresponds to one of the one or more subsequent Larmor frequencies, and
the one or more capacitance blocks are electronically connected to each other in a descending cascading order with respect to the corresponding subsequent Larmor frequencies.

19. An MRI system for imaging one or more subjects comprising:
a magnet assembly that includes a first RF coil and a second RF coil both of a birdcage design having rungs connected by rings, the first RF coil for transmitting a first set of RF pulses into the one or more subjects at a first Larmor frequency and the second RF coil for transmitting a second set of RF pulses into the one or more subjects at a second Larmor frequency different from the first Larmor frequency; and
wherein the first RF coil and the second RF coil are disposed within the magnet assembly such that the rungs and the rings of the first RF coil are offset from the rungs and the rings of the second RF coil.

20. The MRI system of claim 19, wherein at least one of the first Larmor frequency and the second Larmor frequency correspond to hydrogen atoms, carbon atoms, sodium atoms, fluorine atoms, helium atoms, or xenon atoms.

21. The MRI system of claim 19, wherein the first RF coil is a HP birdcage coil and the second RF coil is a LP birdcage coil.

22. The MRI system of claim 19, wherein the second RF coil is further disposed within the first RF coil.

23. A method for magnetic resonance imaging one or more subjects comprising:
transmitting a first set of RF pulses into the one or more subjects via a first RF coil at a first Larmor frequency;
transmitting a second set of RF pulses into the one or more subjects via a second RF coil at a second Larmor frequency that is different from the first Larmor frequency; and
wherein both the first RF coil and the second RF coil are of a birdcage design having rungs connected by rings, and
the first RF coil and the second RF coil are disposed within a magnet assembly such that the rungs and the rings of the first RF coil are offset from the rungs and the rings of the second RF coil.

24. The MRI system of claim 23, wherein at least one of the first Larmor frequency and the second Larmor frequency correspond to hydrogen atoms, carbon atoms, sodium atoms, fluorine atoms, helium atoms, or xenon atoms.

25. The MRI system of claim 23, wherein the first RF coil is a HP birdcage coil and the second RF coil is a LP birdcage coil disposed within the first RF coil.

26. The MRI system of claim 23, wherein the first set of RF pulses and the second set of RF pulses are transmitted simultaneously.

* * * * *